(12) United States Patent
van de Beek et al.

(10) Patent No.: US 8,198,943 B2
(45) Date of Patent: Jun. 12, 2012

(54) ELECTRONIC CIRCUIT FREQUENCY GENERATION

(75) Inventors: Remco Cornelis Herman van de Beek, Eindhoven (NL); Jozef Reinerus Maria Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 12/964,396

(22) Filed: Dec. 9, 2010

(65) Prior Publication Data

US 2011/0140791 A1    Jun. 16, 2011

(30) Foreign Application Priority Data

Dec. 10, 2009  (EP) .................................. 09178765

(51) Int. Cl.
*H03L 7/18* (2006.01)
(52) U.S. Cl. ............... 331/17; 331/14; 331/16; 327/157
(58) Field of Classification Search ............. 331/14, 331/16, 17; 327/157
See application file for complete search history.

(56) References Cited

U.S. PATENT DOCUMENTS

| 5,757,238 A * | 5/1998 | Ferraiolo et al. ............. 331/16 |
| 6,771,133 B2 * | 8/2004 | Lautzenhiser ................ 331/17 |
| 2005/0012528 A1 | 1/2005 | Kodama |
| 2011/0134964 A1 | 6/2011 | van de Beek et al. |
| 2011/0188543 A1 | 8/2011 | van de Beek et al. |

FOREIGN PATENT DOCUMENTS

| CN | 101 471 662 A | 7/2009 |
| EP | 2 066 036 A2 | 6/2009 |
| WO | 03/067762 A1 | 8/2003 |

OTHER PUBLICATIONS

Extended European Search Report for Patent Appln. No. 09178765.5 (Jun. 17, 2010).
"Standard ECMA-368; High rate Ultra Wideband PHY and MAC Standard", ecma international, 3$^{rd}$ edition, Dec. 2008, retrieved from the internet at: http://www.ecma-international.org/publications/standards/Ecma-368.htm, 345 pgs. (Oct. 18, 2011).
Leenaerts, D. et al. "A SiGe BiCMOS 1ns Fast Hopping Frequency Synthesizer for UWB Radio", IEEE International Solid-State Circuits Conference, Dig. Tech. Papers, 3 pgs. (2005).
Razavi, B, et al. "A 0.13μm CMOS UWB Transceiver", IEEE International Solid-State Circuits Conference, Dig. Tech. Papers, 3 pgs. (Feb. 2005).
Staszewski, R. B., et al. "All-Digital Phase-Domain TX Frequency Synthesizer for Bluetooth Radios in 0.13 μm CMOS", IEEE International Solid-State Circuits Conference, Dig. Tech. Papers, vol. 527, 10 pgs. (Feb. 2004).

* cited by examiner

*Primary Examiner* — James E Goodley

(57) ABSTRACT

An oscillation signal with a selectable frequency is generated with a phase locked loop (10, 12, 14). The oscillator (10) of the loop receives a feedback signal, to which an offset is added in order to reduce transient effects when a frequency modification is made. A first and second offset control value are used to control the offset successively. The first offset control value is controlled by a combination of the frequency settings before and after the modification. The second offset control value is controlled by the frequency settings after the modification. The first and second offset control values are used to control an offset of applying to a frequency control signal of an oscillator (10) of the phase locked loop (10, 12, 14). The offset controlled by the first control offset value is applied during a predetermined time interval before the offset controlled by the second control offset value is applied.

7 Claims, 5 Drawing Sheets

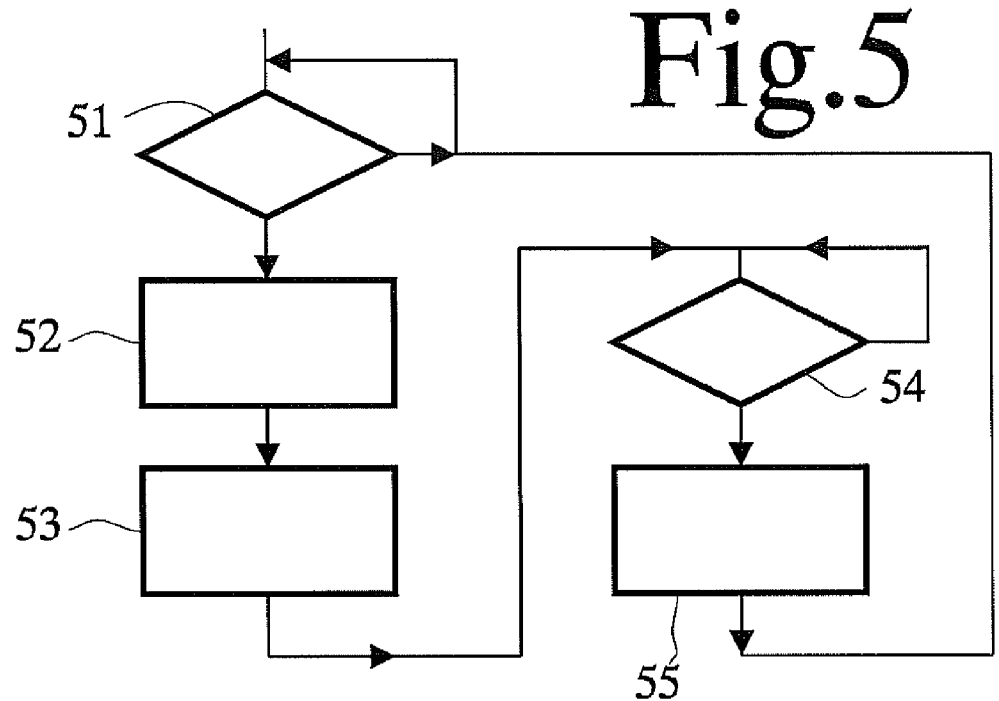
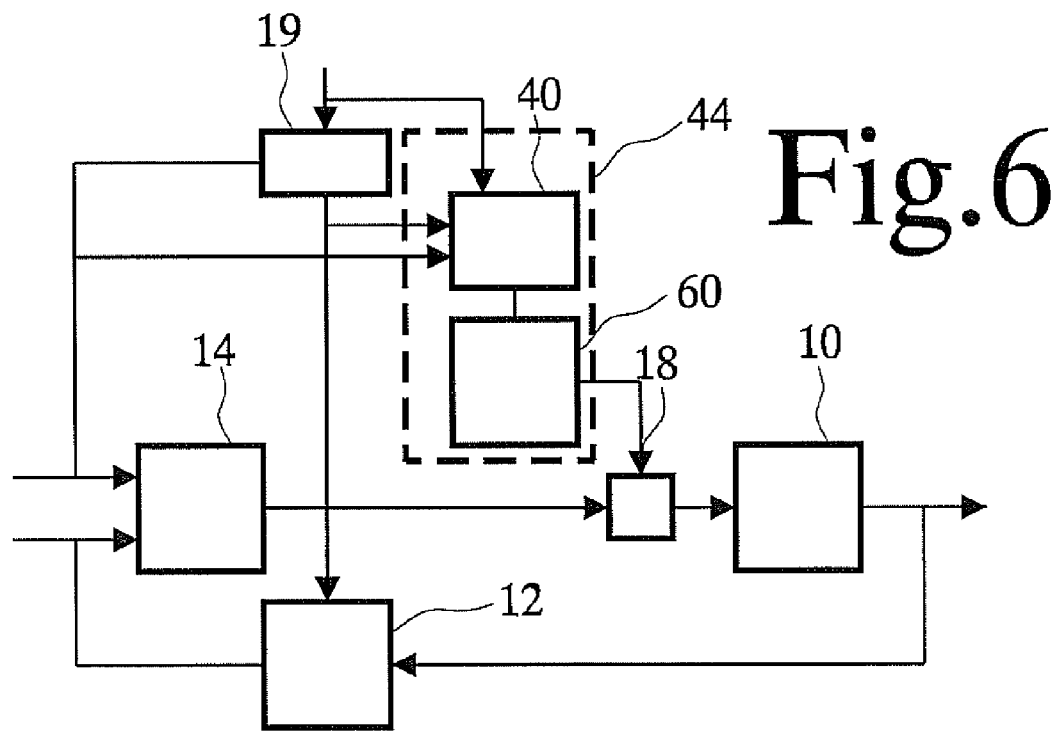

ELECTRONIC CIRCUIT FREQUENCY GENERATION

CROSS-REFERENCE TO RELATED APPLICATIONS

This application claims the priority under 35 U.S.C. §119 of European patent application no. 09178765.5, filed on Dec. 10, 2009, the contents of which are incorporated by reference herein.

FIELD OF THE INVENTION

The invention relates to an electronic circuit comprising a frequency generator and to a method of frequency generation.

BACKGROUND

Fast frequency hopping is difficult to implement using conventional PLL frequency generators. Frequency generators that provide for fast frequency hopping purposes are required for example in receivers and transmitters for wireless communication such as WiMedia Ultra-Wide Band, where the hopping transient must be shorter than 9.5 ns.

Conventional PLL frequency generators synthesize signals of adjustable frequency by locking the phase of a frequency divided oscillator signal to a reference signal. Changes in the resulting frequency are realized by changing the frequency division ratio. After such changes a transition period typically occurs, before the PLL locks on to the new frequency. As a result, there are limitations on the achievable speed of frequency hopping.

A solution to this problem employs a plurality of phase-locked loops, and a multiplexer to provide an output signal from a selectable one of these loops. In this case different phase locked loops can be made to lock at different frequencies before their output signals are selected, thus avoiding a transition period after selection. Phase locked loops for all necessary frequencies may be used. When the required frequency hops are known in advance two phase locked loops may suffice, of which one is switched to the next frequency while the other still supplies the current frequency.

Such solutions with a plurality of phase locked loops are technically complex and require considerable circuit area and power consumption.

SUMMARY

Among others, it is an object to provide for a reduction of the transition time interval upon switching between different frequencies.

An electronic circuit according to claim 1 and a method according to claim 8 are provided. This circuit comprises a PLL and an offset control circuit with an offset control value determination circuit configured to determine at least a first and second control offset value. The offset determination circuit may comprise storage elements for storing information representing the first and second offset control values for example. A control circuit is provided that causes the offset control circuit to apply the offset controlled by the first control offset value during a predetermined time interval before applying the offset according to the second control offset value, in response to modification of the selected frequency. In this way, the circuit provides for reduction of disturbance of the locked condition due to time delays in the application of modifications of the frequency setting.

The predetermined time interval may be selected based on transitions of the reference signal of the PLL. In a further embodiment the predetermined time interval is ended in response to an earliest transition of the reference signal that affects the phase detected by the phase detector after the modification of the selected frequency. The reference signal may also be used to clock the modifications, so that the reference signal starts the intermediate time interval at one transition and ends the intermediate time interval at a corresponding next transition.

In an embodiment the offset control circuit may comprises a plurality of storage circuits, for storing respective first offset control values, the control circuit being configured to select the first offset control value to control the offset in said time interval dependent on the modification of the selected frequency. Thus for example, if switches between "n" (n=4 for example) are provided for, storage locations for n*(n−1) modifications may be provided for.

In an embodiment the circuit comprises a control circuit configured to calibrate the first offset control values dependent on phase errors detected after further time intervals with a duration of said predetermined time interval after further modifications of the selected frequency. Calibration may be performed in a special calibration mode, and/or on the run during normal operation. On circuit calibration makes the circuit robust against ageing and makes factory based calibration unnecessary.

BRIEF DESCRIPTION OF THE DRAWING

These and other objects and advantageous aspects will become apparent from a description of exemplary embodiments, using the following figures FIG. 5 shows a flow-chart of offset control FIG. 6 shows a circuit with a phase locked loop

DETAILED DESCRIPTION OF EXEMPLARY EMBODIMENTS

Figure 1:
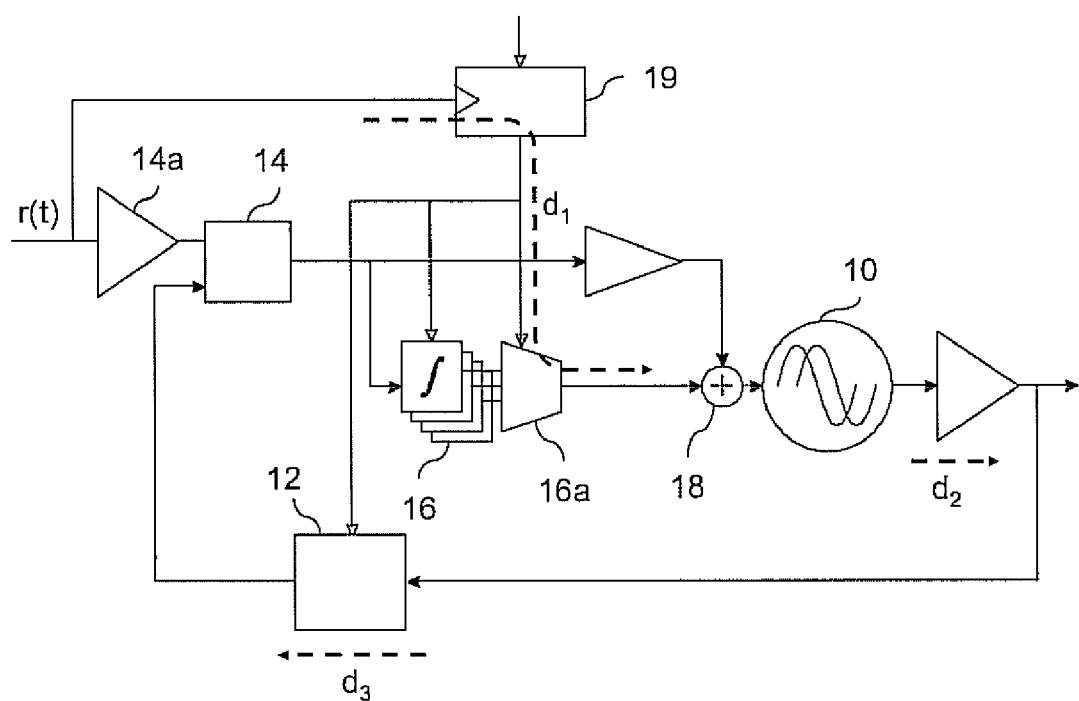
FIG. 1 shows an embodiment of a phase locked loop according to a co-pending patent application

FIG. 1 shows an electronic circuit with a phase locked loop described in a co-pending, unpublished patent application assigned to the same applicant as the present applicant (application number PCT4009IB53375). The phase locked loop comprises an oscillator 10, a frequency divider 12, a phase detector 14, a delay circuit 14a, an offset control circuit 16, 16a, a multiplexer 16a, an adder 18 and a register 19. In addition, several amplifiers, filters or buffers (not labeled) may be present. Oscillator 10 has an output coupled to a first input of phase detector 14 via frequency divider 12. A second input of phase detector 14 is coupled to an input for receiving a reference signal r(t). A reference clock circuit (not shown) may be provided to supply the reference signal. The reference clock circuit may comprise a crystal oscillator for example. An output of phase detector 14 is coupled to a control input of oscillator 10 via adder 18.

The offset control circuit comprises storage circuits 16 and a multiplexer 16a. Storage circuits 16 for storing offset control values. Storage circuits 16 are coupled to a first input of adder 18 via multiplexer 16a. The output of phase detector 14 is coupled to a second input of adder 18. Adder 18 has an output coupled to the control input of oscillator 10. Register 19 has an input for an instruction signal and an output coupled to control inputs of storage circuits 16, multiplexer 16a and frequency divider 12. Register 19 is clocked by reference signal r(t). Delay circuit 14a is coupled between the input from which the reference signal is supplied to the clock input of register 19 and the second input of phase detector 14.

In operation, the basic circuit operation is that of a phase locked loop, wherein phase detector 14 compares the phases of the reference signal r(t) and a divided down version of the oscillator signal, and uses the result of the comparison to control the oscillation frequency. Instruction signals to select the desired frequency are applied to register 19. The instruction signal that is loaded into register 19 controls the frequency division ratio of frequency divider 12.

In addition, storage circuits 16 provide for control offset signals for different frequency selections, which are added to oscillator control signal according to the selected frequency, in order to provide for an initial control of the oscillation frequency that more closely approximates the desired frequency. Thus, settling time after a frequency switch is reduced. Register 19 controls multiplexer 16a to select the storage circuit 16 from which the offset signal is applied to the control input of oscillator 10. Storage circuits 16 store different control offset values for different frequency settings of the phase locked loop respectively. When register 19 loads an instruction signal that controls switching of the phase locked loop to a different frequency, correspondingly changed control offset value is supplied to the oscillator. The control offset values are selected to set the oscillation frequency substantially at the desired frequency. This reduces the transition periods at frequency switching wherein the loop regulates the oscillation frequency to the desired frequency. The control offset values in storage circuits 16 may be calibrated by means of a circuit (shown symbolically as an integrator) that adjusts the control offset values until the resulting output of the phase detector 14 has a predetermined value when locked to the desired frequency.

Delay circuit 14a delays application of the reference signal to phase detector 14, relative to use of the reference signal to control the timing of switching between different frequencies. The co-pending application does so to ensure that different delays in the circuit result in a loss of phase synchronization.

Figure 2:
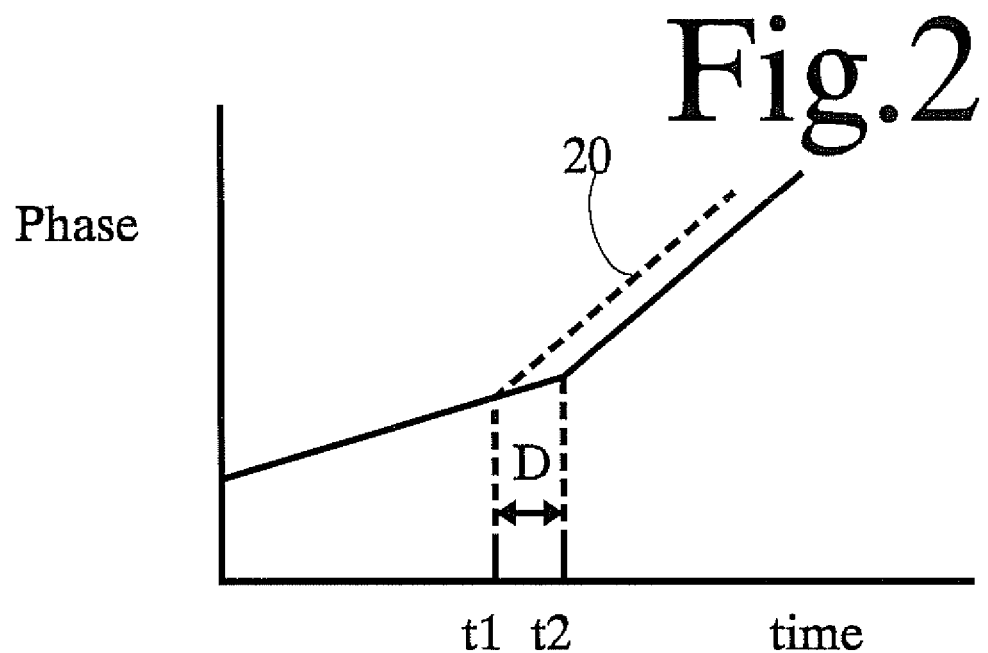
FIGS. 2 and 3 show plots of phase versus time

FIG. 2 illustrates oscillator phase as a function of time for the circuit of FIG. 1. As is well known, linear increase of the phase corresponds to oscillation at a constant frequency. Time intervals of such a linear with mutually different slopes occur when the PLL is locked to different frequencies. The slope changes after modifications of the frequency setting. A first time point t1 is indicated at which a transition in the reference signal r(t) triggers a switch to a modified frequency. In response, register 19 takes over a new input signal and applies it to frequency divider 12, storage circuits 16 and multiplexer 16a. Ideally, this should lead to an immediate frequency change as shown by the dashed line at t1. But in practice this involves delays d1, d2 and d3 as indicated in FIG. 1: d1 is the delay between the transition in the reference signal r(t) and the emergence of the effect of new control offset value at the control input of oscillator 10, d2 is the delay from application of the new control offset to its effect on the output of the PLL and d3 is the delay between a signal change at the output of the PLL and its effect on phase detector 14, via through frequency divider 12.

As shown in FIG. 2 the delays result in a delay D from the first time point t1, of the trigger of the frequency switch, to a second time point t2 at which of slope of the phase (i.e. the frequency) of oscillator 10 changes. The delay D affects the settling time, because it can introduce errors in the phase comparison. Delay circuit 14a delays the reference signal r(t) by the same delay D before it is applied to phase detector 14. In this way it is ensured that during each period of the reference signal r(t) at the input of phase detector 14 the phase detector input from oscillator 10 is the result of a respective single frequency setting. In this way, disturbance of the frequency due to the delay is avoided.

Although delay circuit 14a provides a working solution, it should be noted that delay circuits often involve analog signal processing, which imposes higher requirements on manufacturing than digital solutions. Most of the phase locked loop can be implemented either by means of digital circuits or by means of analog circuits. For example, a digitally operating oscillator 10, adder 18 and phase detector 14 may be used, or an analog oscillator 10, adder 18 and/or phase detector 14 may be used. Frequency divider 12 is usually a digital circuit. Storage circuits 16 may be digital storage circuits, or alternatively storage capacitors may be used as storage circuits. When digital signals are passed from phase detector 14 and storage circuits 16 to oscillator 10, storage circuits 16 may be implemented as a digital memory, multiplexer 16a forming part of the memory.

However, in the circuit of FIG. 1, compensation for the delay involves a delay circuit 14a that must be tuned to delays of other components. It would be desirable to provide for compensation that can be implemented by means of digital processing.

Figure 3:
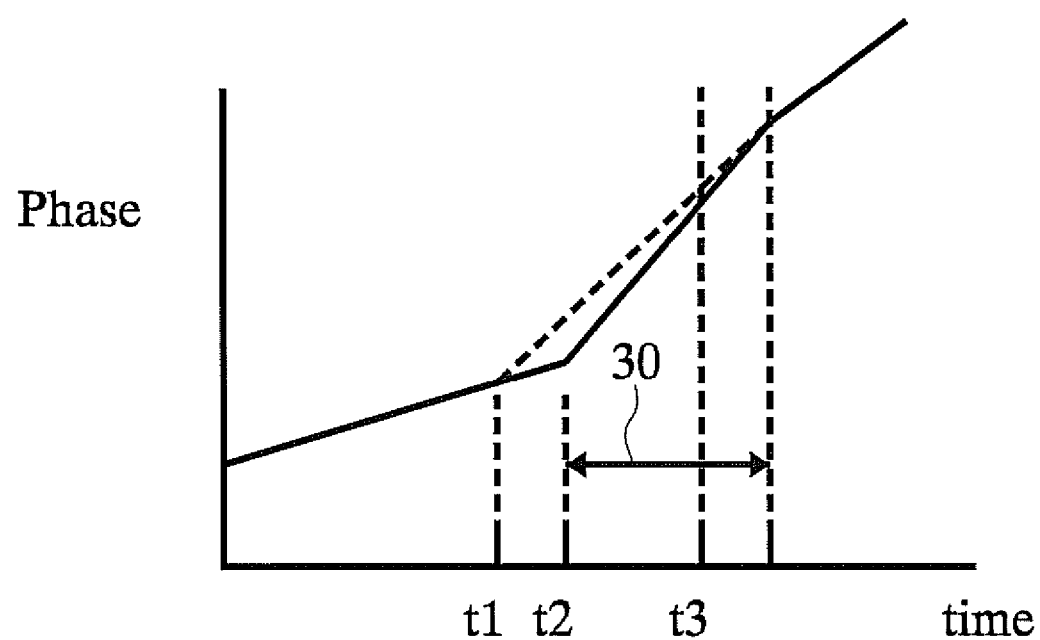

FIG. 3 shows phase as a function of time for the circuit for another embodiment. Herein the switch from a first frequency to a second frequency involves an intermediate state, between an initial state and a final state wherein control signals according to the first and second frequency are applied. During a time interval 30 in which the circuit is in the intermediate state the slope of the phase (the frequency) differs from the slope in the initial and final states. This different slope is used to compensate for the effect of the delay D.

Figure 4:
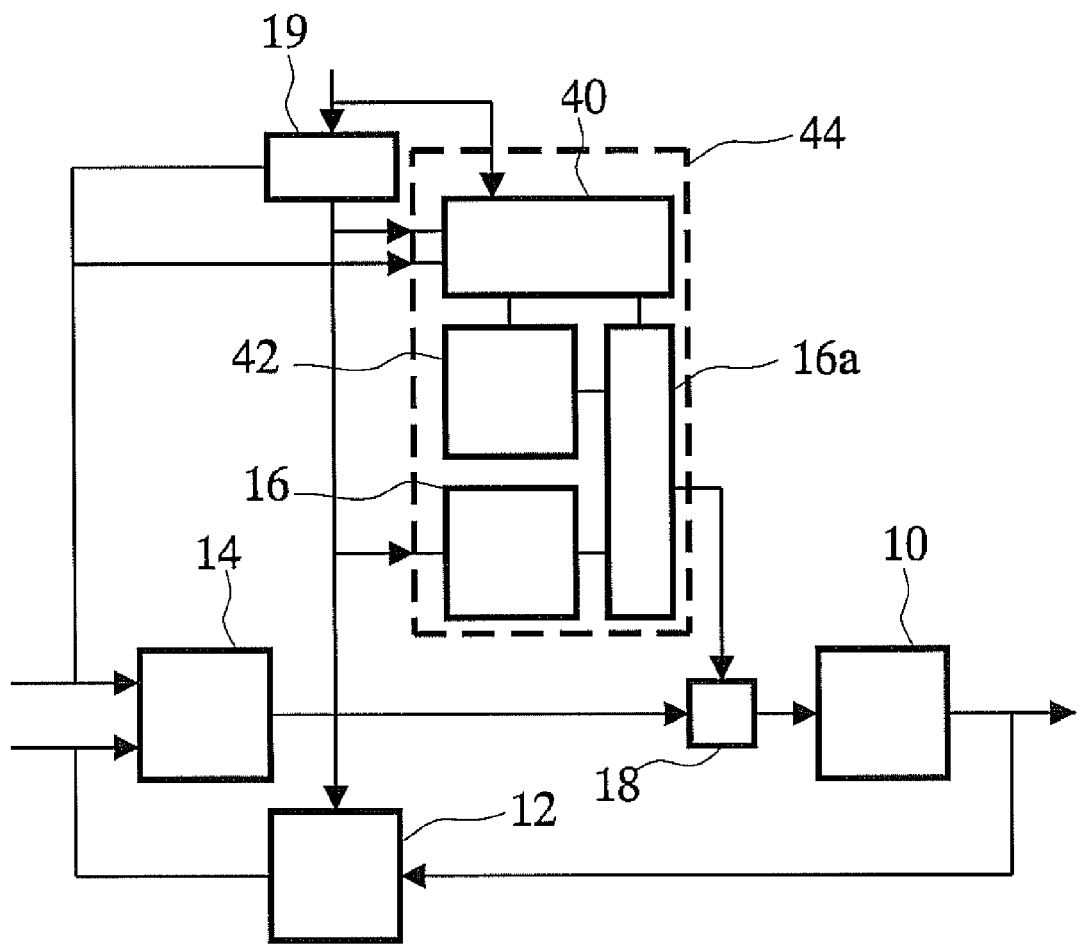
FIG. 4 shows a circuit with a phase locked loop

FIG. 4 shows an electronic circuit that realizes the behavior shown in FIG. 3. The electronic circuit comprises a phase locked loop with an offset control circuit 44 that additionally contains a state controller 40 and a memory 42 comprising storage circuits for storing information representing offset control values. State controller 40 has an input coupled to register 19 and outputs coupled to multiplexer 16a. Furthermore, state controller 40 is coupled to memory 42. Memory 42 serves as a lookup table for first control offset values to be applied to the control input of oscillator 10 during the intermediate state. To distinguish from these first control offset values, the offsets from storage circuits 16 will be referred to as "second control offset values" in the following. State controller 40 is configured to detect switches between different desired PLL frequencies and to activate the intermediate state in response. State controller 40 is configured to select a first control offset value from memory 42 dependent on the switch and to cause multiplexer 16a to supply an offset signal according to the selected first control offset value while the intermediate state is active.

FIG. 5 shows a flow chart of operation. In a first step 51 state controller 40 monitors whether the frequency setting in register 19 is modified.

If so, state controller switches to a succession of the intermediate state and a subsequent normal state. In the intermediate state a control signal derived from memory 42 is temporarily applied to oscillator 10 In the normal state a control signal derived from a selected one of storage circuits 16 is applied to oscillator 10.

When the frequency setting in register 19 is changed, state controller 40 executes a second step 52, wherein it uses a combination of the previous frequency setting and the modified frequency setting to select a location in memory 42, from which a first control offset value will be used. In a third step 53 state controller 40 applies an offset signal determined by the first control offset value of the selected location to multiplexer 16a. Also state controller 40 controls multiplexer 16a to apply this offset signal to adder 18. Thus, state controller 40 brings the circuit into the intermediate state.

In a fourth step 54 state controller 40 waits until a period of the reference signal has passed. Subsequently state controller 40 executes a fifth step 55, wherein it controls multiplexer 16a to feed the offset signal to adder 18 from the storage circuits 16 selected by the modified frequency. From there the process returns to first step 51. Thus, state controller 40 brings the circuit into the final state.

State controller 40 may be implemented using a comparator, with inputs coupled to the input and output of register 19 to compare successive frequency settings and a state register, coupled to an output of the comparator and clocked by the reference signal. The state register may be used to select between offset output from storage circuits 16 and memory 42. The combination of the input and output of register 19 may be coupled to address inputs of memory 42, the resulting data being clocked into an output register of the memory by the reference signal.

FIG. 6 shows an embodiment with an offset control circuit 44 wherein the memories for the first and second control offset values have been combined in a digital memory 60, addressed by state controller 40. Digital memory 60 supplies control offset values form addressed locations to adder 16. In response to a modification of the frequency setting, state controller 40 addresses a first control offset value in a first cycle of the reference signal, followed by a second control offset value in subsequent cycles. In this embodiment the offset control part of controller 40 may merely provide for supply of the combination of the input and output of register 19 to an address input of memory 60, and supply of the reference signal to the clock input of memory 60. Memory may store first offset control values at location addressed with addresses corresponding to mutually input and outputs of register 19 and second offset control values corresponding to mutually input and outputs of register 19.

In an embodiment, preprogrammed first control offset values may be provided in memory 60, 42, for use in the intermediate phase. In an alternative embodiment, the circuit may be designed to provide for calibration of the first control offset values. A feedback method may be used wherein the phase detector output at the end of the first period of the reference signal after a modification of the frequency setting is used to adjust the first control offset value. A regulation feedback method may be used, configured to adjust the first control offset value dependent on a difference between the output of the phase detector at the end of the first period and a predetermined value.

State controller 40 may be configured to execute this loop, for example under software control. Calibration may be performed by switching to a dedicated calibration mode, wherein the frequency settings are modified on purpose to enable adjustment of the first control offset values. Alternatively, modifications of the frequency settings during normal operation may be used.

It may be noted that the second control offset values may likewise be determined in a feedback loop. This loop may be configured to adjust the second control offset values. But a distinction is that the second control offset values may be adjusted dependent on the difference between the phase detector output at the end of periods of the reference signal later than the first period after the modification of the frequency setting. In contrast the first control offset values may be adjusted dependent on the difference between the phase detector output at the end of the first period of the reference signal after the modification of the frequency setting.

In an embodiment, respective first control offset values are provided for respective pairs of frequency settings, before and after modification. In contrast, respective second control offset values may be provided for respective individual frequency settings. Thus, if "n" frequency settings are used (n=4 for example), with possible switches between all frequency settings, n memory locations for second control offset values may be used and n*(n−1) memory locations for first control offset values. Of course fewer locations may be needed when only a limited number of specific frequency switches is used.

Although embodiments have been described wherein storage circuits and/or memories are used as an offset determination circuit to provide the offset control values, it should be appreciated that alternatively the offset determination circuit may comprise arithmetic circuits to provide the offset control values. The electronic circuit may comprise an offset determination circuit with an output for supplying offsets for the control of oscillator 10. The offset determination circuit may comprises storage circuits 16, memory 42 or 60 and/or arithmetic circuits to determine the offset control values.

For example, there may be a known mathematical expression that at least approximately defines the relation between the between the frequency control input signal of oscillator 10 and its oscillation frequency. In this case the electronic circuit may comprise an offset determination circuit with an arithmetic circuit instead of storage circuits 16, configured to compute the second offset control value from the frequency setting according to the mathematical relation.

Similarly the first offset control values may be defined by a mathematical expression. The difference fc=fd−f between a frequency setting "f" of the phase locked loop desired and the frequency fd during the intermediate state after the frequency setting is modified from a previous frequency setting f' may be expressed as fc=(f−f')*D/T, wherein T is the duration of the intermediate state. This may be combined with a mathematical expression offset=G(f) that at least approximately defines the relation between the between the frequency control input signal of oscillator 10 and its oscillation frequency. In this case the electronic circuit may comprise an offset determination circuit with an arithmetic circuit instead of memory 42 or 60, configured to compute the first offset control value from the frequency setting according to the mathematical relation G(f+(f−f')*D/T).

When a memory and/or storage elements are used to determine the offset control values, these values may be represented by digital numbers corresponding to the values for example. Instead of digital numbers other types of information may be used, for example codes that define selections from a table of offset control values. When analog offsets are used, the offset control circuit may comprise a digital to analog converter to convert the information to analog offset signals. When a digital PLL is used, such a converter may not be needed, or when a partly digital PLL is used digital to analog conversion may be applied outside the offset control circuit. In an analog solution, analog information representing offset control values may be stored in storage circuits that are capacitors for example.

Figure 7:
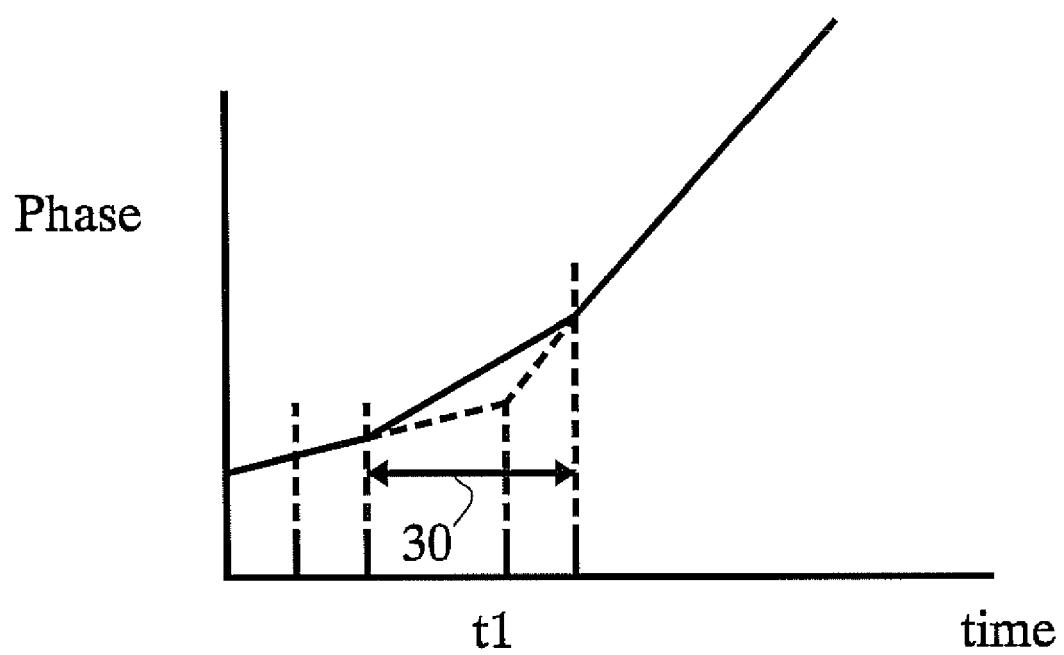
FIG. 7 shows a plot of phase versus time

FIG. 7 shows phase as a function of time for the circuit for another embodiment. Herein the intermediate state is activated before the effective modification time point "t1" at which the modification of the frequency setting must be effected (and is applied to frequency divider 12). In this embodiment a corrected version of the offset control for the preceding frequency is used in the intermediate state before that effective modification time point. A difference fc=fd−f' between a frequency setting "f" before the modification and the frequency fd during the intermediate state may be used, the difference satisfying the same relation as when the intermediate state is applied after said modification time point. This may be implemented by using an additional register (not shown) in series with register 19 between register 19 and frequency divider 12, to delay the frequency setting.

Although embodiments have been described wherein a frequency divider 12 is used to effect the frequency setting or the phase locked loop, it should be appreciated that the same type of offset control may be applied to phase locked loops wherein the frequency is set by other means, for example by using an auxiliary loop around an accumulator phase detector.

Although embodiments have been described wherein the control offset is applied by means of an adder 18, wherein it is added to a signal derived from phase detector 14, it should be appreciated that other ways of applying the offset may be used. For example, an oscillator 10 may be used that has a plurality of inputs for applying offsets in different ways Although embodiments have been described wherein the intermediate phase lasts until a first transition of the reference signal after the modification of the frequency setting, it should be appreciated that a different duration may be used, as long as correspondingly different first control offset values are used, that compensate for the phase error due to the delay.

The invention claimed is:

1. An electronic circuit comprising
a phase locked loop having a loop frequency selection input and including a controllable oscillator with an oscillator frequency control input,
an offset control circuit coupled to the oscillator frequency control input to apply an offset to a control signal of the controllable oscillator, the offset control circuit including an offset control value determination circuit configured to determine at least a first and a second control offset value at least partly independently of one another;
a control circuit with a control circuit input coupled to the loop frequency selection input and a control circuit output coupled to the offset control circuit, the control circuit being configured to cause the offset control circuit to apply the offset controlled by the first control offset value during a predetermined time interval before applying the offset according to the second control offset value, in response to a modification of the selected frequency, wherein the phase locked loop comprises a phase detector with a first input coupled to an input for receiving a reference signal, a second input coupled to an oscillator output of the controllable oscillator and an output coupled to the oscillator frequency control input, the control circuit having an input coupled to the input for the reference signal, the control circuit being configured to select the predetermined time interval based on transitions of the reference signal.

2. An electronic circuit according to claim 1, wherein the offset control value determination circuit comprises a plurality of storage circuits, for storing information representing the first and the second offset control values, the offset being determined from that information.

3. An electronic circuit according to claim 1, wherein the control circuit is configured to end the predetermined time interval in response to an earliest transition of the reference signal that affects the phase detected by the phase detector after the modification of the selected frequency.

4. An electronic circuit according to claim 1, wherein the control circuit is configured to start the predetermined time interval at a first transition of the reference signal before a second transition that triggers the modification, the predetermined time interval being ended in response to the second transition.

5. An electronic circuit according to claim 1, wherein the offset control circuit comprises a plurality of storage circuits, for storing respective first offset control values, the control circuit being configured to select the first offset control value to control the offset in said time interval dependent on the modification of the selected frequency.

6. An electronic circuit according to claim 1, wherein the control circuit is configured to calibrate the first offset control values dependent on phase errors detected after further time intervals with a duration of said predetermined time interval after further modifications of the selected frequency.

7. A method of generating an oscillation signal with a selectable frequency from a phase locked loop, the method comprising
detecting a modification of a frequency setting of the phase locked loop; and in response to detection
determining a first offset control value from a combination of the frequency settings before and after the modification;
determining a second offset control value from the frequency settings after the modification;
using the first and second offset control values to control an offset of applying to a frequency control signal of an oscillator of the phase locked loop, the offset controlled by the first control offset value being applied during a predetermined time interval selected based on transitions of a reference signal of the phase locked loop before the offset controlled by the second control offset value is applied.

* * * * *